(12) United States Patent
Ermochkine et al.

(10) Patent No.: US 8,444,907 B2
(45) Date of Patent: May 21, 2013

(54) METHOD FOR PRODUCING PATTERNED MATERIALS

(75) Inventors: Alexander Ermochkine, Chapel Hill, NC (US); Derek Schorzman, Cary, NC (US); Jacob Sprague, Chapel Hill, NC (US)

(73) Assignee: Liquidia Technologies, Inc., Morrisville, NC (US)

( * ) Notice: Subject to any disclaimer, the term of this patent is extended or adjusted under 35 U.S.C. 154(b) by 572 days.

(21) Appl. No.: 12/630,569

(22) Filed: Dec. 3, 2009

(65) Prior Publication Data

US 2010/0173113 A1 Jul. 8, 2010

Related U.S. Application Data

(60) Provisional application No. 61/120,327, filed on Dec. 5, 2008.

(51) Int. Cl.
*B27N 3/18* (2006.01)
*B29C 59/02* (2006.01)
*B29C 35/08* (2006.01)
*B32B 27/00* (2006.01)
*B32B 3/00* (2006.01)
*B29C 65/00* (2006.01)

(52) U.S. Cl.
USPC ............ 264/496; 264/1.1; 264/239; 264/248; 264/249; 264/294; 264/319; 264/330; 264/331.11; 264/494; 264/495; 156/242; 156/275.1; 156/275.3; 156/275.5; 156/275.7; 977/887; 428/57; 428/58

(58) Field of Classification Search
USPC ................... 264/1.1, 239, 248, 249, 294, 319, 264/330, 331.11, 494, 495, 496; 156/242, 156/275.1, 275.3, 275.5, 275.7; 977/887; 428/57, 58
See application file for complete search history.

(56) References Cited

U.S. PATENT DOCUMENTS 5,597,613 A    1/1997    Galarneau et al.
6,976,424 B2 *   12/2005   Bruno et al. ................. 101/327

(Continued)

FOREIGN PATENT DOCUMENTS

WO    2005/101466 A2    10/2005
WO    2008/143650 A2    11/2008

OTHER PUBLICATIONS

Kao et al. (Fabrication of the patterned flexible OLEDs using a combined rolling imprinting and photolithography method. pp. 1-3, Proceedings of 2005 5th IEEE Conference on Nanotechnology, Nagoya, Japan, Jul. 2005).*

(Continued)

*Primary Examiner* — Christina Johnson
*Assistant Examiner* — Atul P. Khare
(74) *Attorney, Agent, or Firm* — Morgan, Lewis & Bockius LLP

(57) ABSTRACT

A large area patterned film includes a first patterned area; a second patterned area; and a seam joining the first patterned area and the second patterned area, wherein the seam has a width less than about 20 micrometers. A method for tiling patterned areas includes depositing a predetermined thickness of a curable material; contacting a first portion of the curable material with a mold; curing the first portion of the curable material; removing the mold from the cured first portion of the curable material; contacting a second portion of the curable material with the mold, such that the mold contacts a portion of the cured first portion of the curable material; curing the second portion of the curable material; and removing the mold to yield a seam between the cured first portion of the curable material and the cured second portion of the curable material, wherein the seam has a dimension less than about 20 micrometers.

8 Claims, 8 Drawing Sheets

U.S. PATENT DOCUMENTS

| | | | |
|---|---|---|---|
| 7,229,685 B2 * | 6/2007 | Full et al. ................... 428/343 |
| 7,718,326 B2 * | 5/2010 | Stenger ........................ 430/22 |
| 7,824,516 B2 * | 11/2010 | Amos et al. ................ 156/247 |
| 7,976,759 B2 | 7/2011 | Henn et al. |
| 8,011,916 B2 * | 9/2011 | Suehira et al. .............. 425/385 |
| 8,027,086 B2 * | 9/2011 | Guo et al. ............... 359/485.05 |
| 8,128,393 B2 | 3/2012 | Rolland et al. |
| 2005/0005801 A1 * | 1/2005 | Thallner ..................... 101/483 |
| 2006/0210755 A1 | 9/2006 | Blazek |
| 2007/0275193 A1 | 11/2007 | DeSimone et al. |
| 2008/0131692 A1 | 6/2008 | Rolland et al. |
| 2008/0251976 A1 | 10/2008 | Rolland et al. |
| 2008/0265447 A1 * | 10/2008 | Bae ............................... 264/1.1 |
| 2009/0028910 A1 | 1/2009 | DeSimone et al. |
| 2009/0098380 A1 | 4/2009 | Henn et al. |

OTHER PUBLICATIONS

International Search Report and Written Opinion from International Application No. PCT/US2009/066595, dated May 25, 2010.

Jeong, H.E., et al. "Generation and Self-Replication of Monolithic, Dual-Scale Polymer Structures by Two-Step Capillary-Force Lithography," Small Journal, 2008, vol. 4, No. 11, pp. 1913-1918.

* cited by examiner

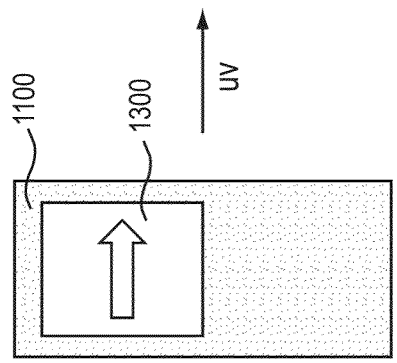
FIG. 3C
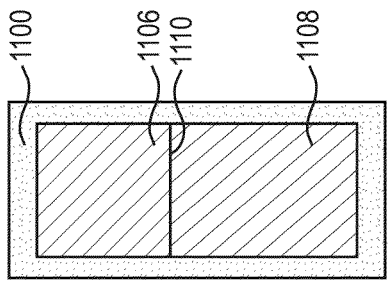
FIG. 3F
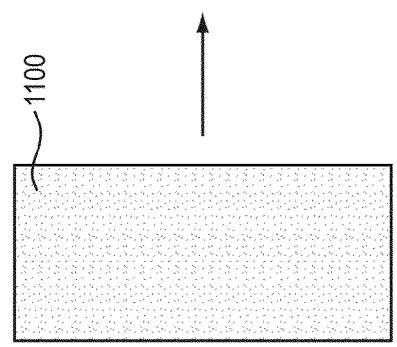
FIG. 3B
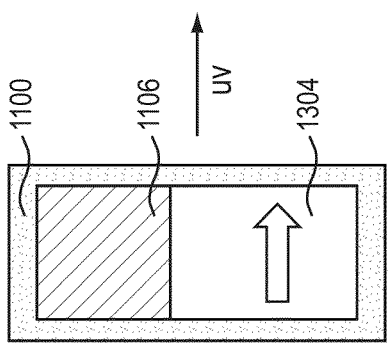
FIG. 3E
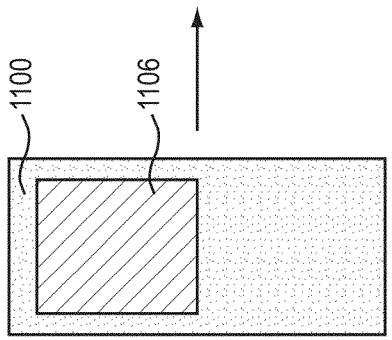
FIG. 3A
FIG. 3D

METHOD FOR PRODUCING PATTERNED MATERIALS

CROSS-REFERENCE TO RELATED APPLICATIONS

This application claims the benefit of U.S. Provisional Patent Application No. 61/120,327, filed Dec. 5, 2008, which is incorporated herein by reference in its entirety.

STATEMENT REGARDING FEDERALLY SPONSORED RESEARCH OR DEVELOPMENT

This invention was made with United States Government support under cooperative agreement number 70NANB7H7026 awarded by the National Institute of Standards and Technology (NIST). The United States government may have certain rights in this invention.

INCORPORATION BY REFERENCE

Each reference identified herein is hereby incorporated by reference as if set forth in its entirety.

BACKGROUND

There is a need to take small patterned areas (e.g., patterned silicon wafers) and expand their footprint in order to manufacture large area products. Maintaining fidelity and mechanical strength in the large area product is crucial to the products success. Expanding the footprint is typically done by "tiling" methods, through which one makes multiple copies of the original pattern and abuts or tiles them together to form a larger pattern. The resulting patterned template can have the form factor of a large flat area or cylindrical roll. Tiling methods currently in the art include various forms of physical and chemical attachment including brackets, adhesives (e.g., tape, polymeric binders, epoxies, etc.), welding, and others. Ideally a minimal seam is created, for functional and aesthetic purposes. In production, large seams can cause trapping of fluid in low spots, poor contact between patterned roll and product film, mechanical weakening of the tool, loss of fidelity of patterned areas, yield loss, visible "defects" in optical or viewing performance, and other drawbacks. These drawbacks can translate into defects in the final product that can affect performance, particularly for films used in light management or display applications.

SUMMARY OF EMBODIMENTS OF THE INVENTION

There is a need in the art for fabricating high fidelity seams and methods for producing such high fidelity seams between patterned areas. According to some embodiments of the present invention, a method for tiling patterned areas includes depositing a predetermined thickness of a curable material; contacting a first portion of the curable material with a mold; curing the first portion of the curable material; removing the mold from the cured first portion of the curable material; contacting a second portion of the curable material with the mold, such that the mold also contacts a portion of the cured first portion of the curable material; curing the second portion of the curable material; and removing the mold. In some embodiments, the method yields a seam between the first cured portion of the curable material and the second cured portion of the curable material. In some embodiments, the seam has a dimension less than about 20 micrometers. In some embodiments, the dimension of the seam is less than about 5 micrometers. In some embodiments, the dimension of the seam is less than about 500 nanometers. In some embodiments, the dimension of the seam includes a width or a height.

In some embodiments, prior to contacting the first portion of the curable material with a mold, the curable material is cured to a thickness less than the predetermined thickness such that a surface of the curable material remains substantially uncured. In some embodiments, the uncured material is substantially liquid. In some embodiments, a thickness of the substantially uncured surface is controlled by controlling an oxygen concentration to which the curable material is exposed. In some embodiments, contacting the mold with the curable material substantially protects the curable material from oxygen. In some embodiments, the mold is substantially transparent, for example, to UV light.

In some embodiments, curing the first portion of the curable material includes treating substantially all of the curable material with radiation while the first portion of the curable material is substantially protected from exposure to oxygen by the mold. In some embodiments, curing the first portion of the curable material causes the first portion of the curable material to retain a pattern of the mold when the mold is removed from the first portion of the material. In some embodiments, curing the first portion of the curable material forms a first patterned region in the curable material and curing the second portion of the curable material forms a second patterned region in the curable material. In some embodiments, a seam between the first patterned region and the second patterned region has a width less than about 5 micrometers. In some embodiments, a seam between the first patterned region and the second patterned region has a height less than about 1 micrometer.

According to some embodiments of the present invention, a method for fabricating a substantially seamless pattern includes providing a first portion of curable material between a mold and a substrate proximate a nip point; passing the first portion of curable material, the mold, and the substrate through the nip point; curing the first portion of curable material; removing the mold from the first cured portion; providing a second portion of curable material over at least a portion of the first cured portion between the mold and the substrate; passing the second portion of curable material, the mold, and the substrate through the nip point; curing the second portion of curable material to form a second cured portion; and removing the mold. In some embodiments, a seam between the first cured portion and the second cured portion has a dimension less than about 5 micrometers. In some embodiments, the dimension is less than about 1 micrometer. In some embodiments, the dimension is less than about 500 nanometers. In some embodiments, the mold comprises a fluoropolymer. In some embodiments, the curable material is a radiation-curable polymeric material.

In some embodiments, passing the first portion of the curable material, the mold, and the substrate through a nip point results in depletion of the first portion of curable material prior to the mold and substrate exiting the nip point such that the curable material tapers to depletion between the mold and substrate. In some embodiments, providing the second portion of curable material includes adding the second portion of curable material to at least a portion of the depleted portion of the first cured portion such that the second portion substantially fills the tapered depletion to a pre-depletion thickness of curable material. In some embodiments, curing the first portion of the curable material causes the first portion of curable material to retain a pattern imparted from the mold after the mold is removed from the first portion of curable material. In some embodiments, curing the first portion of the curable material forms a first patterned region in the first cured portion and curing the second portion of curable material forms a second patterned region in the second cured portion. In some embodiments, a seam between the first patterned region and the second patterned region has a dimension less than about 250 nanometers.

According to some embodiments of the present invention, a method for tiling patterned areas includes distributing a first volume of curable material between a mold and a substrate, wherein when distributed the first volume undercoats the mold; curing the first volume to form a first cured area; separating the mold from the substrate, wherein the first cured area remains coupled with and/or adjacent to the substrate; distributing a second volume of curable material adjacent the first cured area between the mold and the substrate, wherein when distributed the second volume undercoats the mold and overlaps the first cured area; curing the second volume to form a second cured area; and separating the mold from the substrate, wherein the first and second cured areas remain coupled with and/or adjacent to the substrate. In some embodiments, the overlapped first and second cured areas results in a seam having a dimension of less than about 20 micrometers. In some embodiments, the dimension is less than about 1 micrometer. In some embodiments, the dimension is a width of the seam. In some embodiments, the dimension is a height of the seam.

A large area patterned film, according to some embodiments of the present invention, includes a first patterned area; a second patterned area; and a seam joining the first patterned area and the second patterned area, wherein the seam has a width less than about 20 micrometers. In some embodiments, the seam has a height greater than about 50 nanometers and less than about 5 micrometer. In some embodiments, the width and/or height of the seam is less than about 5 micrometers. In some embodiments, the width and/or height of the seam is less than about 1 micrometer. In some embodiments, the height of the seam is greater than about 50 nanometers and less than about 1 micrometer. In some embodiments, the height of the seam is greater than about 50 nanometers and less than about 500 nanometers. In some embodiments, the width of the seam is less than about 5 micrometers and the height of the seam is greater than about 50 nanometers and less than about 500 nanometers.

BRIEF DESCRIPTION OF THE DRAWINGS

Reference is made to the accompanying drawings which show illustrative embodiments of the present invention and which should be read in connection with the description of the invention.

FIGS. 3A-3F show a method according to another embodiment of the present invention;

DETAILED DESCRIPTION OF EMBODIMENTS OF THE INVENTION

Figure 1A:
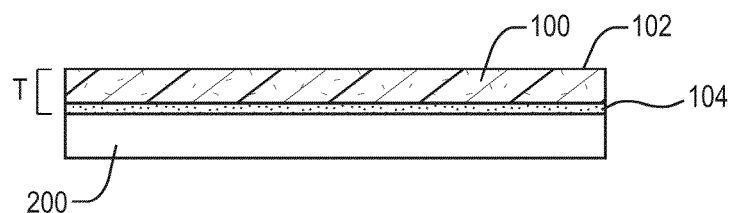
FIGS. 1A-1E show a method according to an embodiment of the present invention.
Figure 1B:
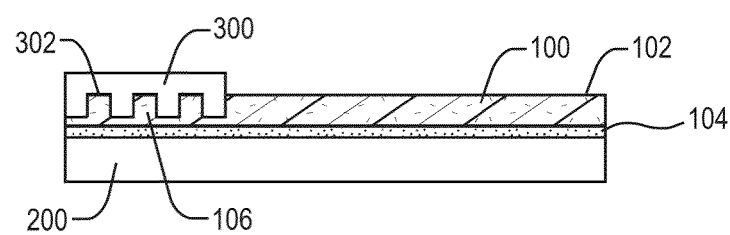
Figure 1C:
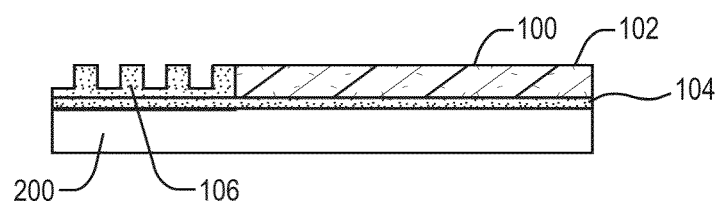

According to some embodiments, the present invention includes methods and systems for producing patterned materials. A method of the present invention includes contacting a curable material, for example, an ultra violet (UV) curable material, with one or more molds or applying the curable material to a substrate. In some embodiments, a method of the present invention includes engaging a first portion of a curable material with a first mold, curing the first portion of the curable material or all of the curable material in the presence of oxygen, engaging a second portion of the curable material with a second mold, and curing the second portion of the curable material while in contact with the mold. In some embodiments of the present invention, the second portion of the curable material includes, is adjacent to, or overlaps a portion of the first portion of the curable material, thereby forming a large area substantially seamless article, drum, intermediate, or the like. In some embodiments of the present invention, the second mold contacts a portion of the first portion of the curable material. In some embodiments of the present invention, the first mold covers an area greater than an area defined by the first portion of the curable material.

According to some embodiments, the present invention includes the products produced by any of the methods described herein. In some embodiments, the methods of the present invention create large area substantially seamless tiled articles or intermediate tools such as but not limited to large area intermediate master templates or drums for roll-to-roll processing. Following the methods of the present invention yields large area near-seamless tiled patterned areas of cured material that can be used as an article itself or which can be replicated with the mold materials disclosed herein (and in the patent application incorporated herein by reference) which large area mold can then in turn be used to produce large area near-seamless patterned area devices, displays, drums, tools, or the like.

Curable Material:

The curable material of the present invention may include any suitable curable material known in the art. In some embodiments, the curable material of the present invention comprises, without limitation, one or more polymers or monomers. In some embodiments, the curable material is deformable prior to curing. In some embodiments, the curable material is in a substantially liquid state (e.g., flowable condition) prior to curing. According to some embodiments, curing the curable material of the present invention includes hardening, for example, by chemical reaction (e.g., polymerization), phase change, a melting/cooling transition, evaporation, moisture cure, combinations thereof, and the like. The curable material can also be a solution of one or more polymers and/or monomers and one or more solvents and the curable material can cure (e.g., hardens) when the one or more solvents evaporate.

In some embodiments, the curable material cures when treated with radiation (e.g., UV-radiation). In some embodiments, the curable material comprises a UV-curable material (e.g., resin) that does not cure when exposed to oxygen (e.g., oxygen from the air). Most UV-curable resins are based on multifunctional monomers and oligomers which generate highly cross-linked polymers by a photoinitiated radical polymerization. Free radicals formed by the photolysis of the initiator are rapidly scavenged by oxygen molecules, thereby hindering polymerization. See, for example, Pieke and Heering, "Depth tracing the influence of oxygen on UV curing," Proc. SPIE 6616, (2007), which is incorporated herein by reference in its entirety. In some embodiments, a surface layer of the curable material is exposed to oxygen (e.g., oxygen from the air) and remains substantially in an uncured state (e.g., liquid state) when treated with radiation (e.g., UV-radiation), whereas a base layer of the curable material located between the surface layer of the curable material and a substrate is cured.

Examples of suitable curable materials useful in the present invention include, without limitation, acrylates, methacrylates, vinyl monomers, butadienes, styrenes, propene, acrylonitrile, methacrylnitrile, acrylamide, methacrylamide allyl acetates, acetals, fumarates, maleates, ethylenes, propylenes, tetrafluoroethylene, ethers, isobutylene, fumaronitrile, acrylic acids, amides, imides, carbohydrates, esters, urethanes, siloxanes, formaldehyde, phenol, urea, melamine, isoprene, isocyanates, epoxies, bisphenol A, alcohols, silanes, dihalides, dienes, alkyl olefins, ketones, aldehydes, vinylidene chloride, anhydrides, saccharide, acetylenes, naphthalenes, pyridines, lactams, lactones, acetals, thiiranes, episulfide, peptides, cellulose, carbonates, polymers thereof, derivatives thereof, and combinations thereof.

Molds:

Molds useful in the present invention may have any suitable configuration known in the art for imparting one or more patterns or textures to the curable material. In some embodiments, the molds useful in the present invention are configured to impart a micro- and/or nanometer scale pattern to the curable material. In some embodiments, a mold useful in the present invention includes a patterned side configured to engage with (e.g., contact) the curable material and an unpatterned side opposite the patterned side. In some embodiments, a mold useful in the present invention includes one or more cavities configured to accept (e.g., be filled by) the curable material. In some embodiments, a mold useful in the present invention includes a plurality of cavities arranged in a predetermined pattern. In some embodiments, each cavity has a substantially predetermined size and/or shape. In some embodiments, the mold includes cavities having different sizes and/or shapes. In some embodiments, the mold includes micro and/or nano-sized cavities. In some embodiments, the largest dimension of a cavity is from about 10 nm to about 500 micrometers.

In some embodiments of the present invention, the molds are constructed from one or more materials that are preferably flexible, non-toxic, substantially UV-transparent, tough, have a low surface energy, and are substantially resistant to swelling. In other embodiments, the molds are substantially rigid. The mold materials of the present invention, according to some embodiments, include photocurable and/or thermal curable components, for example, materials that can be cured from a liquid to a solid upon application of a treatment such as actinic radiation or thermal energy. The properties of these materials can be tuned over a wide range through the judicious choice of additives, fillers, reactive co-monomers, and functionalization agents. It will be appreciated that the materials described herein can be combined in numerous ways to form different mold materials for use in the present invention.

In preferred embodiments, a mold useful in the present invention is constructed of a polymeric material. In some embodiments, the mold includes a low surface energy polymer. In some embodiments, the mold includes a fluoropolymer. In some embodiments, the mold includes a polymer chosen from the FLUOROCUR® resin series. In some embodiments, the mold is made by casting a thin film of curable polymer material between a master template (e.g., a patterned silicon wafer) and a polymer sheet (e.g., PET), curing the polymer material, and removing the cured polymer material from the master template. In alternative embodiments, the mold can be made in a thermoplastic material by hot embossing against a master template.

Preferred materials that can be useful with and/or as the mold materials in the present invention include, in some embodiments, low surface energy polymeric materials. Low surface energy molding materials provide superior wetting properties and facile release from the curable materials described in the present invention, yielding patterned substrates with high fidelity and minimal defects due to stiction. In some embodiments, the mold can have a surface energy below about 25 mN/m. In further embodiments, the mold can have a surface energy below about 20 mN/m. In still further embodiments, the mold can have a surface energy below about 18 mN/m. In yet another embodiment of the present invention, the mold can have a surface energy below about 15 mN/m. In yet another embodiment, the mold can have a surface energy below about 12 mN/m.

In some embodiments, the mold can be a low surface energy elastomer-based material, for example, silicone, perfluoropolyether, or material with similar characteristics. In some embodiments, the mold can be or include a substantially solvent-resistant elastomer-based material, such as but not limited to a fluoropolymer, a fluorinated elastomer-based material, a fluoropolyether, perfluoropolyether (PFPE), PFPE-based materials, combinations thereof, or the like. As used herein, the term "substantially solvent-resistant" refers to a material, for example, an elastomeric material, that neither swells nor dissolves beyond a nominal amount in common hydrocarbon-based organic solvents or acidic or basic aqueous solutions. In some embodiments, the mold is made of a substantially UV-transparent material.

In some embodiments, the molds used in the present invention include a material selected from the group including a fluoropolymer, a perfluoropolyether, a fluoroolefin, an acrylate, a silicone such as for example polydimethylsiloxane (PDMS) or fluorinated PDMS, a polyether, a styrenic, a fluorinated thermoplastic elastomer (TPE), a triazine fluoropolymer, a perfluorocyclobutyl, a fluorinated epoxy, a fluorinated monomer or fluorinated oligomer that can be polymerized or crosslinked, a combination thereof, or the like.

In some embodiments the mold material is chosen to be compatible with the curable material. Parameters that can affect compatibility can include chemical compatibility (i.e. substantially no reactivity or permeability between mold and curable material), modulus, viscosity, surface energy, adhesion or the like. In some embodiments, a mold with higher surface energy can be used to pattern a curable material with low surface energy.

In some embodiments, the molds used in the present invention include flexible, patterned materials, such as metals, oxides, semiconductors, ceramics, and composites.

Further embodiments of molds of the present invention are disclosed in the following references, which are hereby incorporated in their entirety: WO 2005/084191 filed Feb. 14, 2005; U.S. 2007-0275193 filed Aug. 11, 2006; and US 2008-0131692 filed Dec. 4, 2006.

Substrate:

In some embodiments of the present invention, the curable material is applied to a substrate. The substrate can comprise any suitable material known in the art. In some embodiments, the substrate comprises one or more of the materials described herein for molds useful in the present invention. In some embodiments, the substrate includes one or more polymers (e.g, polycarbonate, acrylic, or PET). In some embodiments, the substrate includes one or more metals or semiconductors (e.g., steel, silicon, or aluminum). In some embodiments, the substrate is glass. In some embodiments, the substrate may include at least one of a wafer, glass, plastic, polycarbonate, PEN, or PET. In some embodiments, the substrate is substantially uv-transparent; for example, a uv-transparent substrate could be used with an opaque mold using the methods described herein.

In some embodiments, the substrate is substantially flexible. In other embodiments, the substrate is substantially rigid. In some embodiments, the substrate is sacrificial. In some embodiment the substrate of the present invention includes substrates that have a selected affinity or lack of affinity for the curable materials of the present invention. In some embodiments the substrate has a substantially planar surface to which the curable material is applied. In some embodiments, the substrate has a substantially curved surface to which the curable material is applied. In some embodiments, the substrate is in the form of a sheet, plate, cylinder, film, disc, roller, wafer, or the like. In some embodiments, the substrate, configured as a cylinder, roller, or drum, once tiled as disclosed herein can be used as a device or tool for patterning articles, films, mold making, or the like in a roll to roll or batch mode process. In yet other applications, the substrate is a sheet and when tiled with patterned areas as described herein can be a film or component of a display application, light management applications, photovoltaic devices, or the like. Also, the large area substantially seamless tiled patterned film can be used as an intermediate master from which a large area mold can be fabricated for processing large area substantially seamless patterned films, display screens, light management application components, photovoltaic device components, or the like.

In some embodiments, the substrate is coated with a layer containing one or more adhesion promoters. The adhesion promoter can be a monomeric, oligomeric, or polymeric adhesion promoter or a solution including one or more of these adhesion promoters. In some embodiments, the one or more adhesion promoters are applied to the substrate in order to enhance the affinity (e.g., bond strength) between the curable material and the substrate. Adhesion promoters useful in some embodiments of the present invention include any commercially available primers or adhesion promoters known in the art that are compatible with the substrate and the curable material. Preferably, the adhesion promoter comprises a polymeric adhesion promoter or a solution including one or more polymeric adhesion promoters according to some embodiments of the present invention.

In some embodiments, wherein the substrate is a polymer substrate, the adhesion promoter is preferably a tie-layer polymer. In some embodiments, the tie-layer polymer is a linear polymer having a primary monomeric component that is the same as or an analogue to the primary monomeric component of the polymer substrate to be treated (e.g., such that the two respective polymers share solubilities in common solvents). In some embodiments, the tie-layer polymer further includes one or more monomer units which each provide a reactive vinyl group (e.g., acrylic) as a side-chain on the tie-layer polymer backbone. In some embodiments, the vinyl moieties are randomly present along the tie-layer polymer chain. In some embodiments, application of the tie-layer polymer to the substrate results in reactive vinyl groups being presented on a surface of the substrate, the reactive vinyl groups being capable of forming covalent linkages with the curable material (e.g., upon curing of the curable material).

In some embodiments, the tie-layer polymer is applied to the polymer substrate in a solution containing one or more solvents. In some embodiments, the one or more solvents are capable of dissolving the substrate polymer as well as the tie-layer polymer. In some embodiments, the tie-layer polymer solution is coated on the substrate in such a way that the one or more solvents swell and/or partially dissolve a surface of the polymer substrate. This allows, in some embodiments, an intermixing of the substrate polymer and the tie-layer polymer, resulting in a pseudo-interpenetrating network between the substrate and the tie-layer following evaporation and/or diffusion of the solvent(s) away from the substrate-tie-layer interface.

In some embodiments, the curable material is also the substrate. In some embodiments, the introduction of a suitable solvent to the substrate substantially liquefies or dissolves a surface layer of the substrate. In some embodiments, the surface layer of the substrate is contacted with a mold of the present invention and cured (e.g. hardened) by solvent evaporation.

Oxygen Quenching Method:

A method according to some embodiments of the present invention includes applying a layer of curable material to a substrate, contacting a first portion of the curable material with a first mold, curing the first portion of the curable material, removing the first mold from the first portion of the curable material, contacting a second portion of the curable material with a second mold, curing the second portion of the curable material, and removing the second mold from the second portion of the curable material.

In some embodiments, the curable material may comprise one or more of the curable materials described above and herein. Preferably, the curable material comprises a UV-curable material (e.g., a UV-curable polymer). In some embodiments, the layer of curable material is applied to the substrate at a predetermined thickness. In some embodiments, the predetermined thickness is from about 50 nm to about 100 micrometers. In some embodiments, the layer of curable material is applied, for example, with a mayer rod, a slot coater, a doctor blade, a nip point, free meniscus or dip coating, or other suitable means known in the art. In some embodiments, the curable material is substantially in a flowable condition (e.g., uncured, liquid state) when applied to the substrate. In some embodiments, the layer of curable material includes a surface that is exposed to oxygen (e.g., exposed to air or other oxygen-containing environment). In some embodiments, the surface that is exposed to oxygen is substantially parallel to a surface of the substrate on which the layer of curable material is applied.

The substrate may comprise one or more of the substrate materials described above and herein. In some embodiments, the substrate is a polymer (e.g, polycarbonate, acrylic, or PET). In some embodiments, the substrate is a metal or semiconductor (e.g., steel, silicon, or aluminum). In some embodiments, the substrate is glass. In some embodiments, the substrate may include at least one of a wafer, glass, plastic, polycarbonate, PEN, or PET. In some embodiments, the substrate is substantially rigid. In some embodiments the substrate is substantially flexible. In some embodiments, the curable material adheres strongly to the substrate. In some embodiments, the curable material substantially wets one of more of the mold surface and the substrate surface. In some embodiments, an adhesion promoter (e.g., a tie-layer polymer) is applied to the substrate surface prior to application of the curable material to the substrate. In some embodiments, the substrate and the curable material have at least one component in common. In some embodiments the substrate has a substantially planar surface to which the curable material is applied. In some embodiments, the substrate has a substantially curved surface to which the curable material is applied.

In some embodiments, the substrate is in the form of a sheet, plate, film, disc, or wafer. In some embodiments, the substrate is in the form of a cylinder or roller.

In some embodiments, the curable material is initially cured after being applied to the substrate. In some embodiments, the curable material is initially cured to a thickness less than the predetermined thickness of the curable material. In some embodiments, the initial curing includes treating the curable material such that a base layer of the curable material cures (e.g., hardens) while a surface layer of the curable material remains substantially uncured (e.g., substantially in a liquid state), the base layer being between the surface layer of the curable material and the substrate. In some embodiments, the thickness of the cured base layer and the uncured surface layer can be controlled by varying parameters, for example, initiator concentration, the addition of free radical scavengers, oxygen concentration, and UV exposure intensity and duration. In some embodiments, the thickness of the base layer is substantially larger than the thickness of the surface layer. In some embodiments, the thickness of the curable material layer is controlled such that substantially the entire layer remains uncured upon exposure to UV light in the presence of oxygen.

In some embodiments, a first mold is applied to a first portion of the curable material. In some embodiments, the first mold is applied such that the first portion of the curable material is positioned between the first mold and the substrate. In some embodiments, the first portion of the curable material is the portion of the curable material covered by the first mold. In some embodiments, the first mold includes a pattern whereby the first portion of the curable material conforms to (e.g., fills) the pattern of the first mold. In some embodiments, the first mold is constructed of one or more polymeric materials, as described herein. In some embodiments, the first mold is UV-transparent. In some embodiments, the first mold includes a fluoropolymer, silicone, polyether, or the like. In some embodiments, the first mold includes a polymer chosen from the FLUOROCUR® resin series. In some embodiments, the first mold is made by casting a thin film of curable polymer material between a master template and a polymer sheet, curing the polymer material, and removing the cured polymer material from the master template.

In some embodiments, the first mold is applied to the first portion of the curable material manually (e.g., by hand, using a roller). In some embodiments, the first mold is applied to the first portion of the curable material by an automated system (e.g., by a laminator). In some embodiments, the first mold is applied to the first portion of the curable material by passing the first mold and the first portion of the curable material through a nip point.

In some embodiments, the first portion of the curable material is then cured. In some embodiments, the first portion of the curable material is cured while engaged with (e.g., contacting) the first mold such that a pattern imparted by the first mold to the first portion of the curable is substantially retained in the cured material. In some embodiments, the first portion of the curable material is cured by treating the first portion of the curable material with radiation. In some embodiments, the first portion of the curable material is cured by treating the first portion of the curable material with UV-radiation (e.g., UV light). In some embodiments, curing the first portion of the curable material includes treating substantially the entire layer of curable material with radiation (e.g., UV-radiation). In some embodiments, the first mold substantially protects the first portion of the curable material from exposure to oxygen, thereby allowing the first portion of the curable material to cure. In some embodiments, uncured areas of the curable material exposed to oxygen remain in a substantially uncured (e.g., liquid) state when treated with radiation. For example, in some embodiments, uncured areas of the curable material that are not engaged with the first mold may be exposed to oxygen and remain uncured. In some embodiments, the first mold is removed from the first portion of the curable material after curing the first portion of the curable material.

In some embodiments, a second portion of the curable material is contacted with a second mold. In some embodiments, the second portion of the curable material is the portion of the curable material other than the first portion of the curable material that is covered by the second mold. In some embodiments, the second portion of the curable material includes a cured base layer and an uncured surface layer. In some embodiments, the second portion of the curable material is adjacent to the first portion of the curable material. In some embodiments, the second portion of the curable material is spaced a distance away from the first portion of the curable material.

In some embodiments, the second mold and the first mold have substantially the same physical and/or chemical characteristics. In some embodiments, the second mold and the first mold are the same mold, i.e. the first mold is reused. In some embodiments, the second mold and the first mold are different. In some embodiments, the second mold has a pattern different than a pattern on the first mold. In some embodiments, the second mold and the first mold are constructed from the same material. In some embodiments, the second mold is constructed of a polymeric material. In some embodiments, the second mold is UV-transparent. In some embodiments, the second mold includes a fluoropolymer, silicone, polyether, or the like. In some embodiments, the second mold includes a polymer chosen from the FLUOROCUR® resin series. In some embodiments, the second mold is made by casting a thin film of curable polymer material between a master template and a polymer sheet curing the polymer material, and removing the cured polymer material from the master template. In some embodiments, the second mold is applied to the second portion of the curable material manually (e.g., by hand, using a roller). In some embodiments, the second mold is applied to the second portion of the curable material by an automated system (e.g., by a laminator). In some embodiments, the second mold is applied to the second portion of the curable material by passing the second mold and the second portion of the curable material through a nip point. In some embodiments, the second mold is positioned so as to also contact (e.g., cover or overlay) a portion of the cured first portion of the curable material. In some embodiments, the second mold is substantially flexible such that the second mold can bend at or near a point of contact with the cured first portion of the curable material.

In some embodiments, the second portion of the curable material is cured while engaged with (e.g., contacting) the second mold such that a pattern imparted by the second mold to the second portion of the curable is substantially retained in the cured material. In some embodiments, curing the second portion of the curable material includes treating the second portion of the curable material with radiation (e.g., UV-radiation). In some embodiments, curing the second portion of the curable material includes treating substantially the entire layer of curable material with radiation (e.g., UV-radiation). In some embodiments, the second mold substantially protects the second portion of the curable material from exposure to oxygen, thereby allowing the second portion of the curable material to harden when cured. In some embodiments, the second mold is removed from the second portion of the curable material after curing the second portion of the curable material. In some embodiments, any remaining uncured material is removed from the substrate.

In some embodiments, the height of the seam is substantially equivalent to the height of the uncured surface layer of curable material. In some embodiments, the height of the seam is less than the height of the uncured surface layer of curable material.

In some embodiments, a seam is produced between the first and second portions of the curable material. In some embodiments, the seam has a width from about 50 nm to about 20 micrometers. In some embodiments, the seam has a width from about 50 nm to about 10 micrometers. In some embodiments, the seam has a width from about 20 nm to about 5 micrometers. In some embodiments, the seam has a width from about 10 nm to about 5 micrometers. In some embodiments, the seam has a width from about 20 nm to about 1 micrometer. In some embodiments, the seam has a width from about 10 nm to about 500 nanometers. In some embodiments, the seam has a width of less than about 20 micrometers. In some embodiments, the seam has a width of less than about 5 micrometers. In some embodiments, the seam has a width of less than about 1 micrometer. In some embodiments, the seam has a width of less than about 500 nanometers. In some embodiments, the seam has height from about 10 nm to about 10 micrometers. In some embodiments, the seam has height from about 10 nm to about 5 micrometers. In some embodiments, the seam has height from about 10 nm to about 1 micrometer. In some embodiments, the seam has height from about 10 nm to about 500 nanometers. In some embodiments, the seam has height from about 10 nm to about 250 nanometers. In some embodiments, the seam has height from about 10 nm to about 100 nanometers. In some embodiments, the seam has a height of less than about 10 micrometers. In some embodiments, the seam has a height of less than about 5 micrometers. In some embodiments, the seam has a height of less than about 1 micrometer. In some embodiments, the seam has a height of less than about 500 nanometers. In some embodiments, the seam has a height of less than about 250 nm. In some embodiments, the seam has a height of less than about 100 nm.

The term "seam" means a disturbed or affected area between or adjacent one or more patterned areas, where the disturbed or affected area can be in the horizontal or width direction of a plane, in the vertical or height direction extending from a plane, or the combination of width and height disturbance. It should be understood that the adjacent or adjoining patterned areas adjoined by the seam can be aligned in an ordered manner, such as an ordered array, but the patterns of the adjacent patterned areas do not necessarily need to be aligned in any particular manner. Furthermore, the patterns of the adjacent patterned areas do not need to be the same or similar patterned structures as some applications may require or benefit from tiling patterns of altering or different structures. The disturbance or affected area defining the seam can be disturbed structures that are not replicated with high precision or fidelity, such as partial structure replication, or the disturbance or affected area can be lacking all or substantially all structures of the adjacent patterned areas.

In some embodiments, one or more masks may be applied to (e.g., cover) selected portions of the curable material to prevent the selected portions of the curable material from curing. In some embodiments, only the unmasked portions of the curable material are capable of being cured. The one or more masks are preferably configured to substantially prevent exposure of the curable material to radiation that would otherwise cause the curable material to cure. For example, a substantially UV-opaque mask applied to a UV-curable material will substantially prevent the curable material from curing during treatment with UV-radiation by protecting the covered portion from the UV-radiation. In some embodiments, the use of masks permits the curing steps to proceed in an atmosphere substantially free of oxygen. In some embodiments, one or more masks are applied to selected areas of the curable material that are not engaged with the first and/or second molds so as to substantially prevent curing of these areas of the curable material during curing of the first and second portions of the curable material. In some embodiments, one or more masks (e.g., UV-opaque masks) are applied to the unpatterned sided of the first and/or second mold, either directly or as a separate layer, such that only the areas of the curable material engaged with the unmasked portion of the mold will be cured when treated with radiation.

In some embodiments, the UV light may be focused onto selected portions of the curable material to prevent the unselected portions of the curable material from curing. In some embodiments, only the portions of the curable material in contact with the focused UV light are capable of being cured. In some embodiments, the use of focused UV light permits the curing steps to proceed in an atmosphere substantially free of oxygen. In some embodiments, the focused UV light is applied only to selected areas of the curable material that are engaged with the first and/or second molds so as to cure only these areas of the curable material during curing of the first and second portions of the curable material.

FIGS. 1A-1E shows one embodiment of a method according to the present invention that can be used, for example, for making large area substantially seamless tiled patterned devices useful as end products in displays, photovoltaic devices, light management devices, or the like or useful as intermediate master devices for fabricating large area substantially seamless patterned molds. A layer of curable material 100, for example, a UV-curable liquid resin, is applied (e.g., cast) onto substrate 200 at a predetermined thickness T such that a surface layer 102 of the layer of curable material 100 is exposed to oxygen. Surface layer 102 has a thickness that is less than the predetermined thickness T of the layer of curable material 100. Optionally, the curable material 100 is initially cured after application onto substrate 200 by, for example, treating the layer of curable material 100 with radiation (e.g., UV-radiation). In one embodiment, because surface layer 102 is exposed to oxygen, the surface layer 102 remains substantially uncured while base layer 104 is cured.

Following the initial curing, a first portion 106 of the curable material 100 is engaged with (e.g., contacted by) a first mold 300. First mold 300 may be applied to the first portion 106 of the curable material 100 manually, for example, by using a roller, or by an automated process, for example, by using a laminator. First mold 300 may have any suitable configuration known in the art. Preferably, first mold 300 is made from a flexible, UV-transparent material. In some embodiments, first mold 300 is made from one or more of the mold materials as described above. In some embodiments, first mold 300 includes a plurality of cavities 302 which may be arranged in one or more predetermined patterns. The uncured material of first portion 106 substantially conforms to first mold 300 when engaged with first mold 300, for example, by flowing into cavities 302 of first mold 300. Preferably, first mold 300 substantially protects first portion 106 of curable material 100 from exposure to oxygen.

First portion 106 of curable material 100 is then cured. Curing first portion 106, in some embodiments, includes treating first portion 106 with UV-radiation while engaged with a UV-transparent first mold 300. The UV-radiation passes through first mold 300 to cure (e.g., polymerize) the uncured material of first portion 106 while first mold 300 substantially protects first portion 106 from exposure to oxygen. The uncured portions of curable material 100 that are not engaged with first mold 300 remain exposed to oxygen and therefore remain uncured during the treatment with radiation.

Figure 1D:
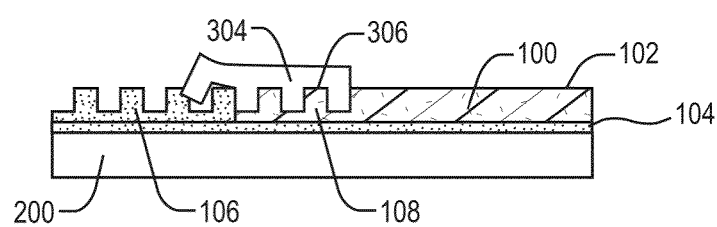

Following the curing of first portion 106, first mold 300 is removed from cured first portion 106. A second portion 108 of curable material 100 is then engaged with a second mold 304. Second portion 108 may be substantially uncured or may include a layer of uncured material and a layer of cured material. In some embodiments, as shown in FIG. 1D, second portion 108 is adjacent to cured first portion 106. In some embodiments, second portion 108 is spaced a distance away from cured first portion 106.

In some embodiments, second mold 304 is positioned such that it contacts (e.g., overlays or covers) a portion of the cured first portion 106. Preferably, second mold 304 substantially protects second portion 108 of curable material 100 from exposure to oxygen. In some embodiments, second mold 304 and first mold 300 are the same mold. In some embodiments, second mold 304 and first mold 300 are different molds. In some embodiments, second mold 304 includes a plurality of cavities 306 that may be arranged in a predetermined pattern that is the same as or different than a pattern of the first mold 300. In some embodiments, second mold 304 has the same physical and/or chemical characteristics as first mold 300. Preferably, second mold 304 is made from a substantially flexible, UV-transparent material.

Figure 1E:
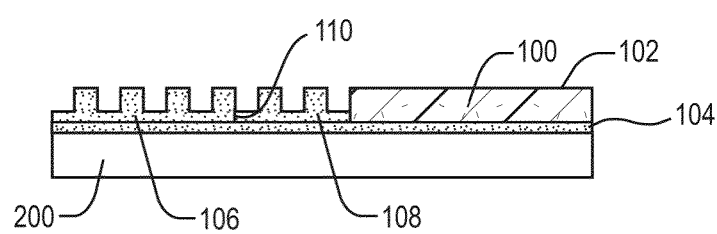

Curing the second portion 108 of curable material 100, in some embodiments, includes treating the second portion 108 with radiation in a manner substantially similar to curing the first portion 106. For example, second portion 108 may be cured by treating second portion 108 with UV-radiation while engaged with a UV-transparent second mold 304. The UV-radiation passes through UV-transparent second mold 304 to cure (e.g., polymerize) the uncured material of second portion 108 while second mold 304 substantially protects second portion 108 from exposure to oxygen. The uncured portions of curable material 100 that are not engaged with second mold 304 remain exposed to oxygen and therefore remain uncured during the treatment with radiation. Following the curing of second portion 108, second mold 304 is removed from cured second portion 108. As shown in FIG. 1E, a seam 110 may be formed where the cured first portion 106 and the cured second portion 108 are joined. In some embodiments, seam 110 has a maximum width of about 10 nm to about 20 micrometers. More preferably, seam 110 has a maximum height of about 10 nm to about 5 micrometers. In one embodiment, FIG. 1E shows a large area substantially seamless patterned area intermediate master, mold, or article (depending on the application).

Starved Bead Method

In some embodiments, a method according to the present invention includes providing a first portion of a curable material between a first mold and a substrate; contacting the first portion of the curable material with the first mold; curing the first portion of the curable material; removing the first mold from the first portion of the curable material; providing a second portion of the curable material over at least a portion of the cured first portion of the curable material between a second mold and the substrate; contacting the second portion of the curable material with the second mold; curing the second portion of the curable material; and removing the second mold from the second portion of the curable material.

In some embodiments, providing a portion of curable material between a mold and a substrate includes applying the curable material to a surface of the substrate, as described previously. In some embodiments, providing a portion of curable material between a mold and a substrate includes applying the curable material to the mold. In some embodiments, a patterned surface of the mold is coated with the curable material. In some embodiments, the curable material is introduced, at least partially, into one or more cavities of the mold. In some embodiments, the portion of curable material covers an area smaller than the area covered by the mold.

In some embodiments, a method according to the present invention includes providing a first portion of a curable material proximate a nip point between a first mold and a substrate; passing the first portion of the curable material, the first mold, and the substrate through the nip point; curing the first portion of the curable material; removing the first mold from the first portion of the curable material; providing a second portion of the curable material over at least a portion of the cured first portion of the curable material between a second mold and the substrate; passing the second portion of the curable material, the second mold, and the substrate through the nip point; curing the second portion of the curable material; and removing the second mold from the second portion of the curable material.

In some embodiments, the nip point is formed between a roller and a surface. In some embodiments, the nip point is formed between a first roller and a second roller. In some embodiments, an edge of the first mold and the substrate are nipped at the nip point prior to providing the first portion of the curable material between the first mold and the substrate. In some embodiments, an edge of the second mold and the substrate are nipped at the nip point prior to providing the second portion of the curable material between the second mold and the substrate. In some embodiments, passing the first portion of the curable material, the first mold, and the substrate through the nip point causes the first portion of the curable material to spread (e.g., roll out) into a layer upon the substrate. In some embodiments, passing the second portion of the curable material, the second mold, and the substrate through the nip point causes the second portion of the curable material to spread (e.g., roll out) into a layer upon the substrate. In some embodiments, the layer of curable material has a region of reduced thickness where the volume of curable material is exhausted prior to reaching at least one edge of the mold (e.g., a starve point or trailing edge). In some embodiments, the region of reduced thickness is at a periphery of the layer.

In some embodiments, the second portion of the curable material is provided over a portion of the first portion of the curable material after the first portion of the curable material is cured. In some embodiments, the second portion of the curable material is provided over the region of reduced thickness (e.g., the starve point or trailing edge) of the cured first portion of the curable material.

In some embodiments, the first and second portions of the curable material each have a predetermined volume. In some embodiments, the predetermined volume is selected such that the entire volume of the first and second portions of the curable material are covered by the first and second molds, respectively. In some embodiments, the predetermined volume is selected such that first and second portions of the curable material each produce a layer of curable material on the substrate having an area less than the areas covered by the first mold and second molds, respectively. In some embodiments, the first and second molds are configured to extend beyond the volumes of the first and second portions of the curable material, respectively. In some embodiments, at least part of the first and/or second molds which extends beyond the volumes of the first and/or second portions of the curable material contacts a surface of the substrate. In some embodiments, the volume of curable material is determined by the characteristics of one of more of the mold, the curable material, or the processing parameters. In some embodiments, the characteristics include the volume of cavities in the mold, the desired thickness of patterned layer, the surface energy of one or more of the mold, substrate, and curable material, the viscosity of the curable material, the area of the mold, the speed and pressure of the roller, or the like.

FIGS. 2A-2F shows one embodiment of a method according to the present invention. In this embodiment, a first portion 400 of a curable material (e.g., a UV-curable resin) is provided between a first mold 600 and a substrate 500 proximate a nip point 700. First portion 400 may be applied as one or more beads of curable material and may have a predetermined volume. First mold 600 is preferably constructed from a substantially flexible, UV-transparent material and includes a plurality of cavities 602 configured to accept the curable material of first portion 400. Nip point 700 is formed between a first roller 702 and a second roller 704, which may rotate in opposite directions, as indicated by the arrows. Prior to providing the first portion 400 of the curable material, an edge 604 of first mold 600 and substrate 500 may be nipped at nip point 700.

Figure 2A:
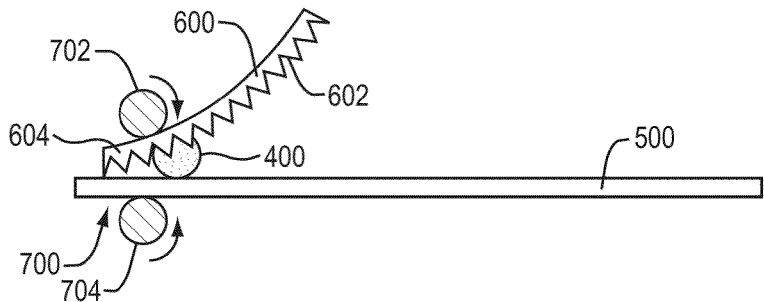
FIGS. 2A-2F show a method according to another embodiment of the present invention.
Figure 2B:
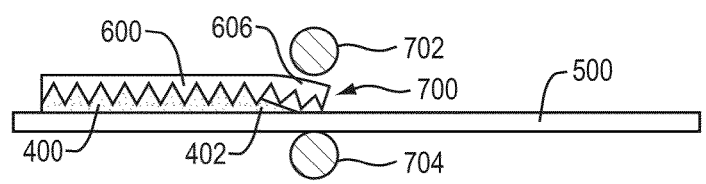

As the first portion 400 of the curable material, the first mold 600, and the substrate 500 are passed through nip point 700, as shown in FIG. 2B, first mold 600 and substrate 500 are pressed towards each other causing the curable material of first portion 400 to substantially fill cavities 602 and causing first portion 400 to spread into a layer upon substrate 500. The layer may include a region 402 having a reduced thickness, located at a periphery of the layer, which is formed as the volume of first portion 400 is exhausted. Portion 606 of mold 600 that extends beyond first portion 400 of the curable material may come into contact with substrate 500.

Figure 2C:
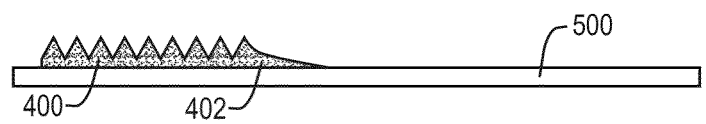

While first portion 400 of the curable material is engaged with first mold 600, first portion 400 is cured, for example, by treatment with UV-radiation. After curing, the first mold 600 is removed from first portion 400. First portion 400, now cured, substantially retains a pattern imparted by first mold 600, as shown in FIG. 2C.

Figure 2D:
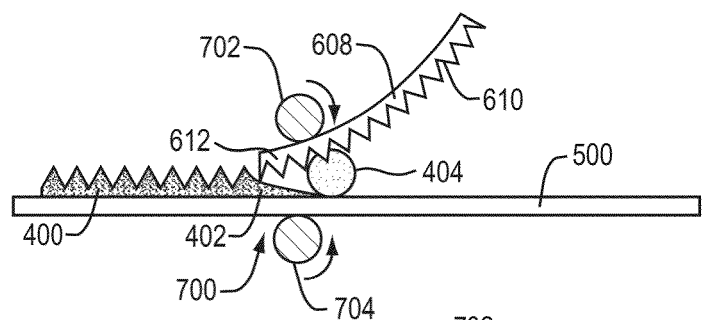
Figure 2E:
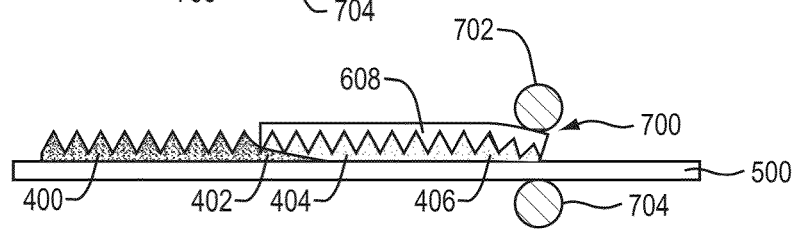
Figure 2F:
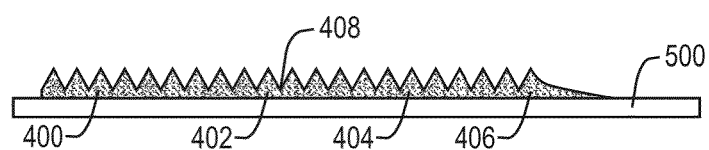
Figure 4C:
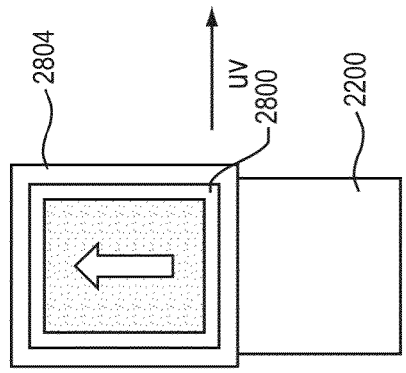
FIGS. 4A-4F show a method according to another embodiment of the present invention.
Figure 4F:
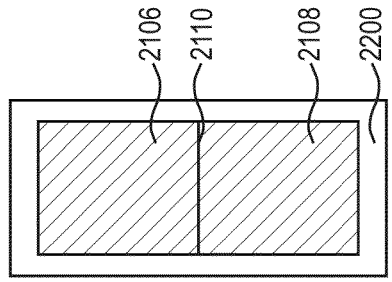
Figure 4B:
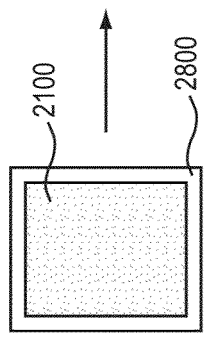
Figure 4E:
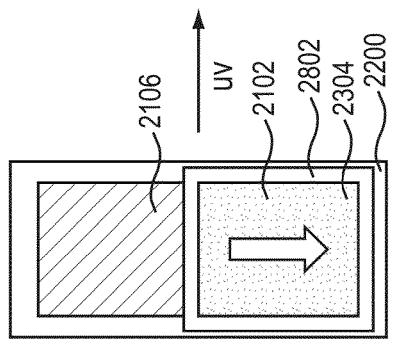
Figure 4A:
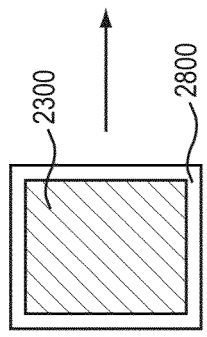
Figure 4D:
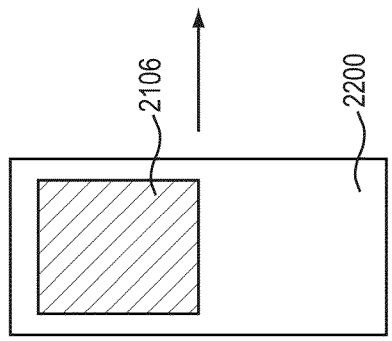

A second portion 404 of the curable material is then provided between a second mold 608 and the substrate 500 proximate nip point 700. Preferably, second portion 404 at least partially overlays the cured first portion 400. In the embodiment shown in FIG. 2D, second portion 404 is provided over region 402 of first portion 400. Second mold 608 may include a plurality of cavities 610 and may have a configuration substantially the same as or different than first mold 600. In some embodiments, second mold 608 and first mold 600 are the same mold. An edge 612 of second mold 608 may be nipped with substrate 500 prior to providing the second portion 404 of the curable material. As shown in FIG. 2D, edge 612 of second mold 608 may be nipped with substrate 500 at or proximate to region 402 of the cured first portion 400.

The second portion 404, the second mold 608, and the substrate 500 are then passed through nip point 700, pressing second mold 608 and substrate 500 towards each other and causing the curable material of second portion 404 to substantially fill cavities 610, and causing second portion 404 to spread into a layer upon substrate 500. The layer formed from second portion 404 overlays region 402 of cured first portion 400 and may also include a region 406 having a reduced thickness, which is formed as the volume of second portion 404 is exhausted.

While second portion 404 of the curable material is engaged with second mold 608, second portion 404 is cured, for example, by treatment with UV-radiation. After curing, the second mold 608 is removed from second portion 404. Second portion 404, now cured, substantially retains a pattern imparted by second mold 608, as shown in FIG. 2C. A seam 408 may be formed where the cured first portion 400 and the cured second portion 404 are joined. Preferably, seam 408 has a maximum width of about 10 nm to about 20 micrometers. Preferably, seam 408 has a height of about 10 nm to about 5 micrometers. Repeating this process can yield a large area substantially seamless tiled patterned intermediate tool from which a large area substantially seamless mold or article can be fabricated.

FIGS. 3A-3F shows another embodiment of a method according to the present invention. According to this embodiment, a surface of substrate 1200 is coated with a curable material 1100 (e.g., a UV-curable resin) that is substantially in a liquid state. One or more adhesion promoters (e.g., tie-layer polymer) may be optionally applied to the surface of substrate 1200 prior to coating with the curable material 1100 in order to enhance bonding between substrate 1200 and curable material 1100, increase durability, reduce defects, increase surface or material uniformity, and the like. The curable material 1100 is then contacted by a first mold 1300 (e.g., a UV-transparent mold), which can be applied to the curable material 1100 by any suitable means. For example, first mold 1300 can be rolled onto curable material 1100 in the direction shown by the arrow in FIG. 3C manually using a roller or applied using a laminator. While engaged with first mold 1300, the curable material 1100 is treated with UV radiation in the presence of oxygen. As illustrated in FIG. 3D, only the portion of curable material 1100 that was covered by first mold 1300 is cured by the UV radiation since only the portion of curable material 1100 covered by first mold 1300 was protected from oxygen. Following the curing step, first mold 1300 is removed, revealing a first cured portion 1106 having an area substantially equal to the area that was covered by first mold 1300. A second mold 1304, which may be the same mold as first mold 1300, is then applied to a second area of curable material 1100. Preferably, second mold 1304 is positioned to overlap (e.g., contact) at least a portion of cured portion 1106. Again, second mold 1304 may be applied by any suitable means, for example, by being rolled onto curable material 1100 in the direction indicated by the arrow in FIG. 3E. After application of second mold 1304, the curable material 1100 is treated once more with UV radiation in the presence of oxygen so as to only cure the uncured portion of curable material 1100 that is covered by second mold 1304. Uncovered portions of curable material 1100, apart from first cured portion 1106, remain uncured due to exposure to oxygen. Following the second curing step, second mold 1304 is removed revealing second cured portion 1108, which is joined to first cured portion 1106 by a seam 1110. Repeating this process can yield a large area substantially seamless tiled patterned intermediate tool from which a large area substantially seamless mold or article can be fabricated.

FIGS. 4A-4F show yet another embodiment of a method according to the present invention. In this embodiment, UV-transparent first mold 2300 is provided having a patterned side and an unpatterned side. A UV-opaque mask 2800 is applied to the unpatterned side of a UV-transparent first mold 2300. A curable material 2100 (e.g., a UV-curable material) is then applied to the patterned side of first mold 2300 and is brought in contact with a substrate 2200 such that the curable material 2100 is substantially positioned between first mold 2300 and substrate 2200. For example, first mold 2300 coated with curable material 2100 may be rolled onto substrate 2200 in the direction shown by the arrow in FIG. 4C. Optionally, one or more additional UV-opaque masks 2804 can be applied in any desired arrangement. For example, an additional UV-opaque mask 2804 may be positioned to cover portions of substrate 2200 not covered by first mold 2300 or be applied to cover additional portions of the unpatterned side of first mold 2300. UV-radiation treatment then follows such that the portion of curable material 2100 not covered by UV-opaque masks 2800 and 2804 is cured. Any portion of curable material 2100 that was covered by UV-opaque masks 2800 and 2804 remain uncured because this portion would not have been exposed to the UV-radiation. Any uncured material remaining on substrate 2200 following the removal of first mold 2300 and masks 2800 and 2804 may be optionally washed away (e.g., using isopropyl alcohol or other suitable solvent), thus leaving only cured portion 2106 on substrate 2200. A second mold 2304, having an unpatterned side with UV-opaque mask 2802 and a patterned side coated with additional curable material 2102 may then be applied to substrate 2200, for example, rolled onto substrate 2200 in the direction indicated by the arrow in FIG. 8E. In one variation, second mold 2304 is the same as first mold 2300. Preferably, second mold 2304 is positioned to slightly overlap an area of cured portion 2106. Additional UV-opaque masks 2804 may optionally be applied again in any desired arrangement, followed by treatment with UV-radiation. Only portions of curable material 2102 not covered by UV-opaque masks 2802 and 2804 are cured, and any portions of curable material 2102 covered by UV-opaque masks 2802 and 2804 remain uncured. Following removal of second mold 2304 and masks 2802 and 2804, any uncured material remaining on substrate 2200 may be optionally washed away (e.g., using isopropyl alcohol or other suitable solvent), thus leaving only cured portions 2106 and 2108 remaining on substrate 2200, which are joined by seam 2110. Repeating this process can yield a large area substantially seamless tiled patterned intermediate tool from which a large area substantially seamless mold or article can be fabricated.

EXAMPLE 1

Synthesis of Tie Layer Materials

Synthesis of Poly[(methyl methacrylate)-co-(2-hydroxyethyl methacrylamide). Methyl methacrylate (35.8 g), 2-hydroxyethyl methacrylamide (6.4 g), and 2,2'-azobisisobutyronitrile (0.16 g) in N,N-Dimethylformamide (60 g) were heated 5 h at 80° C. The cooled solution was precipitated into ethyl ether (300 mL), redissolved in tetrahydrofuran (200 mL) and precipitated again into ethyl ether (300 mL). Residual solvents were removed under reduced pressure to afford 41 g of product (97%).

Scheme 1: Poly[(methyl methacrylate)-co-(2-hydroxyethyl methacrylamide).

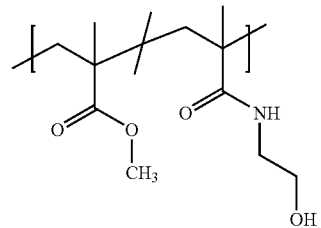

Synthesis of Poly[(methyl methacrylate)-co-(2-[methacryloxy]ethyl methacrylamide)]. A solution of Poly[(methyl methacrylate)-co-(2-hydroxyethyl methacrylamide) (41 g), as prepared above, in toluene (100 mL) was treated with 2,6-di-tert-butyl-4-methylphenol (1.1 g), methacrylic anhydride (14.8 mL), and N-methylimidazole (0.4 g) and heated 15 h at 90 oC. The cooled solution was precipitated into ethyl ether (300 mL), redissolved in chloroform (100 mL) and precipitated into ethyl ether (300 mL) twice. Residual solvents were removed under reduced pressure to afford 34.7 g product.

Scheme 2: Poly[(methyl methacrylate)-co-(2-[methacryloxy]ethyl methacrylamide)].

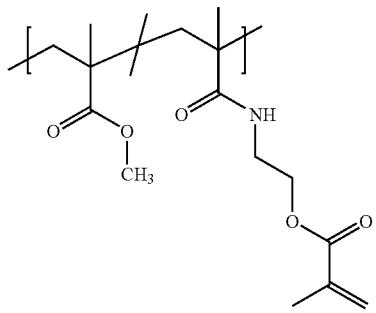

EXAMPLE 2

Thin FLUOROCUR® molds were produced by laminating a thin film of Fluorocur OAE-01 resin between a master template having a patterned array of 200×200 nm cylindrical posts and a 6" wide sheet of PET (MELINEX® D316, DuPont Teijin Films). The mold was placed in a UV flood curing chamber and exposed to UV (approximate output of 125 mW/cm$^2$) for 4 minutes. The PET-Fluorocur laminate was then peeled from the master and trimmed. The approximate patterned area of the mold is 5"×5" square. The Fluorocur thin molds are then used to tile a larger area pattern on an acrylic substrate using the following steps.

The acrylic surface is first prepared with a tie layer. A solution of poly[(methyl methacrylate)-co-(2-(methacryloxy)ethyl methacrylamide] (15 w/w % in chloroform) is applied via lamination (15 psi) between the polymer substrate and a PET cover sheet and remains laminated until diffusion of the chloroform into the bulk of the polymer substrate and away from the interface has occurred (typically 15 h or longer). The cover sheet is then removed to afford a surface with the topology of the cover sheet with grafted methacrylic reactive moieties for covalent adhesion to the UV-curable resin.

Figure 5A:
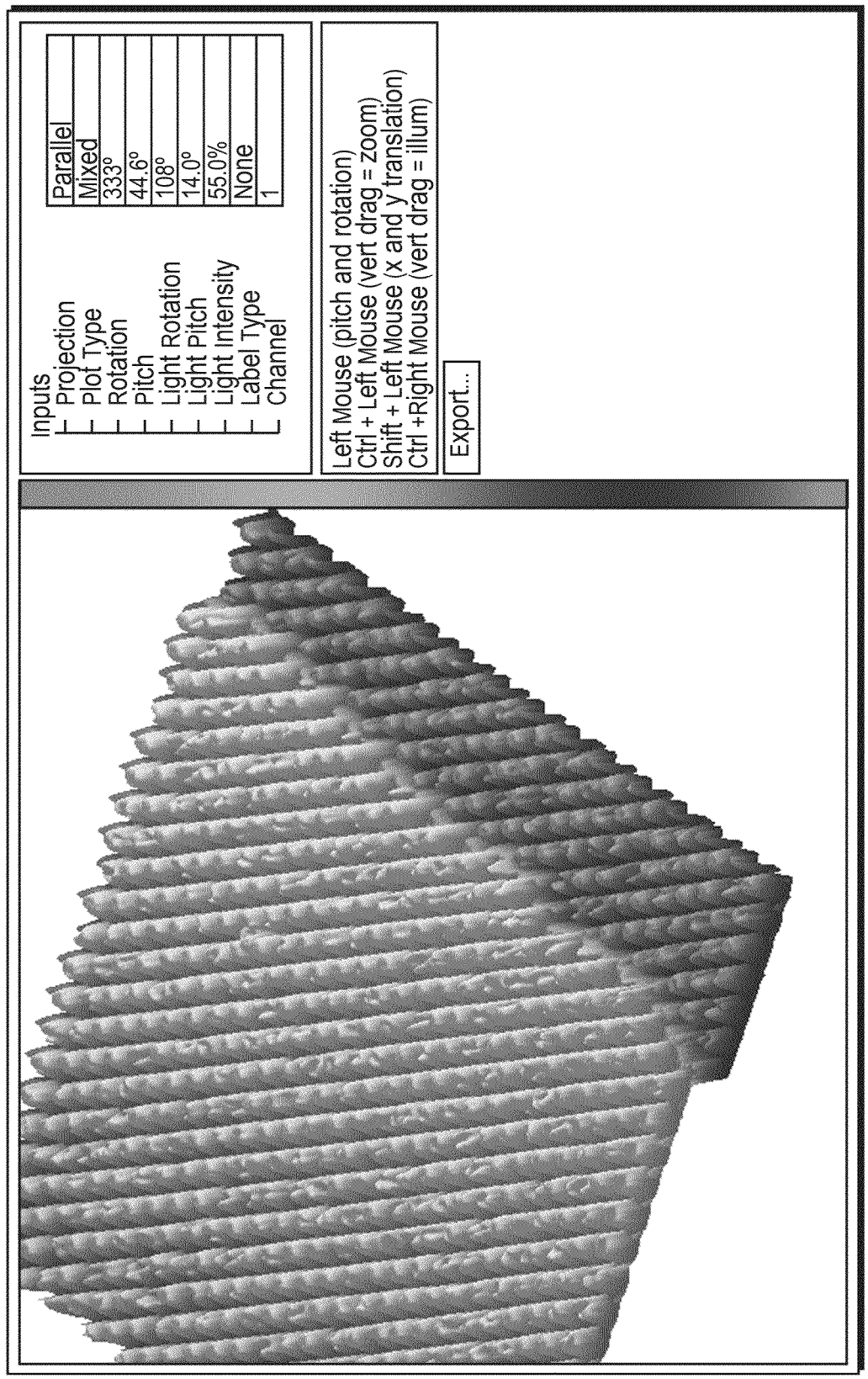
FIGS. 5A-5C show a SEM and AFM images of a seam produced by a method according to an embodiment of the present invention.
Figure 5B:
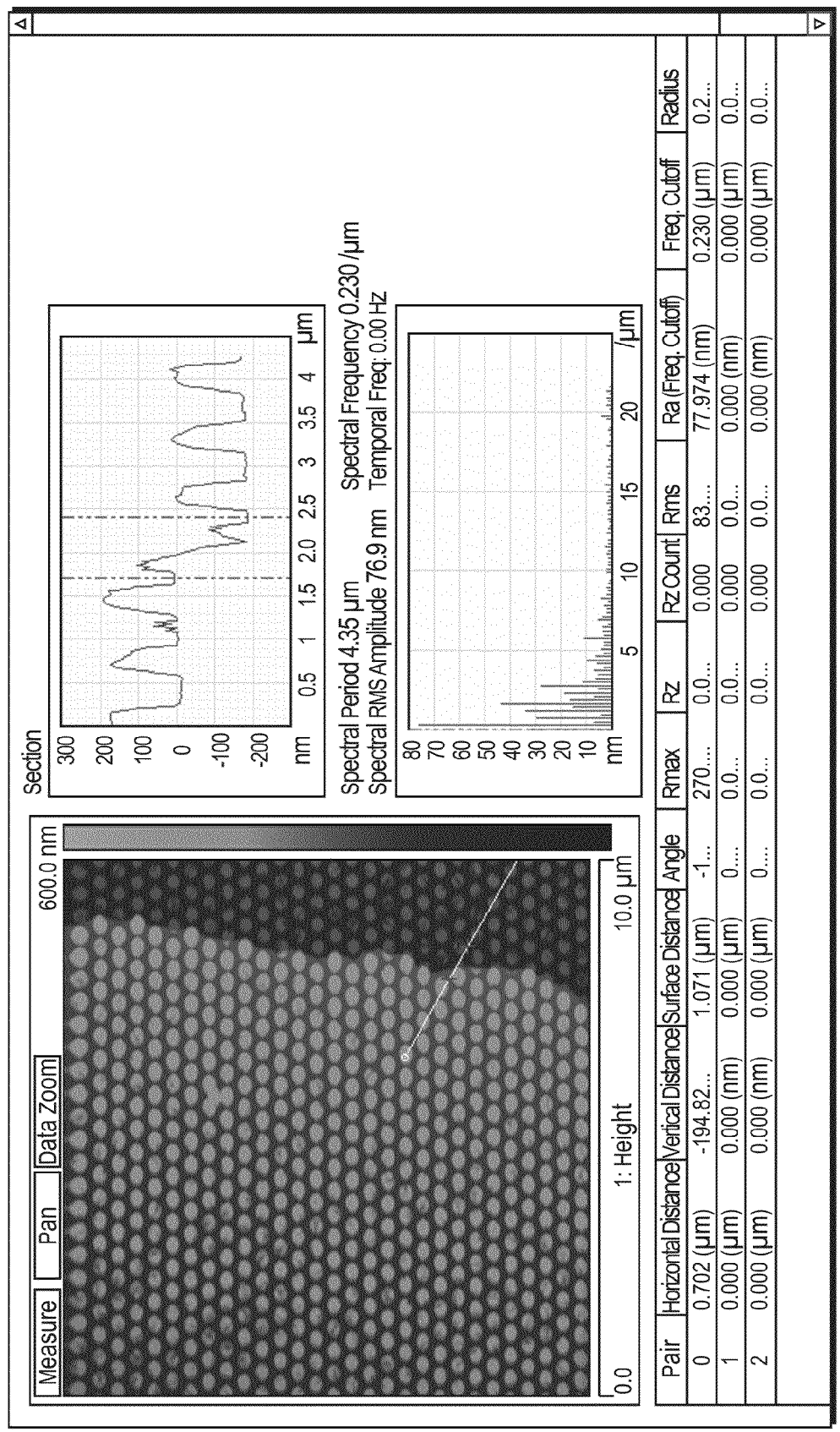
Figure 5C:
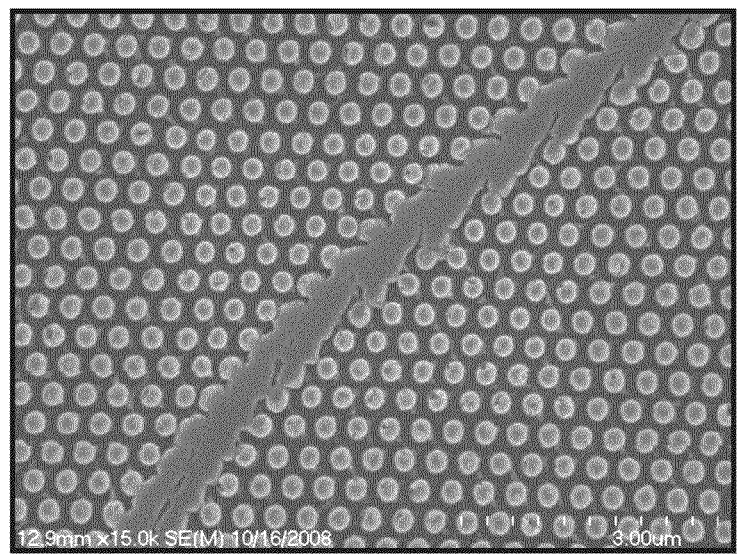

Coat the treated side of the acrylic substrate with a uniform thin layer of TEGO RC 711, a UV curable resin, formulated with 1% diphenyl(2,4,6-trimethylbenzoyl)phosphine oxide/ 2-hydroxy-2-methylpropiophenone blend as a photoinititiator using a #7 Mayer rod from a 20% solids mixture in isopropyl alcohol. Uniformly roll out a Fluorocur thin mold to the coated acrylic pattern side down using a rubber roller, rolling in the direction parallel to the seam, for example, as shown in the embodiment depicted in FIG. 3C. The TEGO RC 711 resin fills the cavities of the mold completely. Place the substrate into the UV flood chamber and cure for 4 minutes. Peel the Fluorocur mold from the substrate. The area underneath the mold exposed to the UV has cured into a pattern that reflects the pattern of the mold, while the area around the mold does not cure at the surface. A second mold is then applied to the substrate in a similar matter, where a portion of the second mold overlaps the cured patterned area. The substrate is placed into the UV chamber and cured for 4 minutes. The second mold is then removed to reveal a second cured, patterned area adjoining the first by a seam. The dimensions of this seam are approximately 1 micrometer wide with a step height of <200 nm. SEM and AFM images of this seam are given in FIGS. 5A-5C.

EXAMPLE 3

Thin FLUOROCUR® molds were produced by laminating a thin film of Fluorocur resin (OAE-01) between a master template having a patterned array of 200 nm diameter×600 nm height cylindrical posts and a 6" wide sheet of PET (MELINEX® D316, DuPont Teijin Films). The mold was placed in a UV flood curing chamber and exposed to UV (approximate output of 125 mW/cm$^2$) for 4 minutes. The PET-Fluorocur laminate was then peeled from the master and trimmed. The approximate patterned area of the mold is 5"×5" square. The Fluorocur thin molds are then used to tile a larger area pattern on PET using the following steps.

Figure 6:
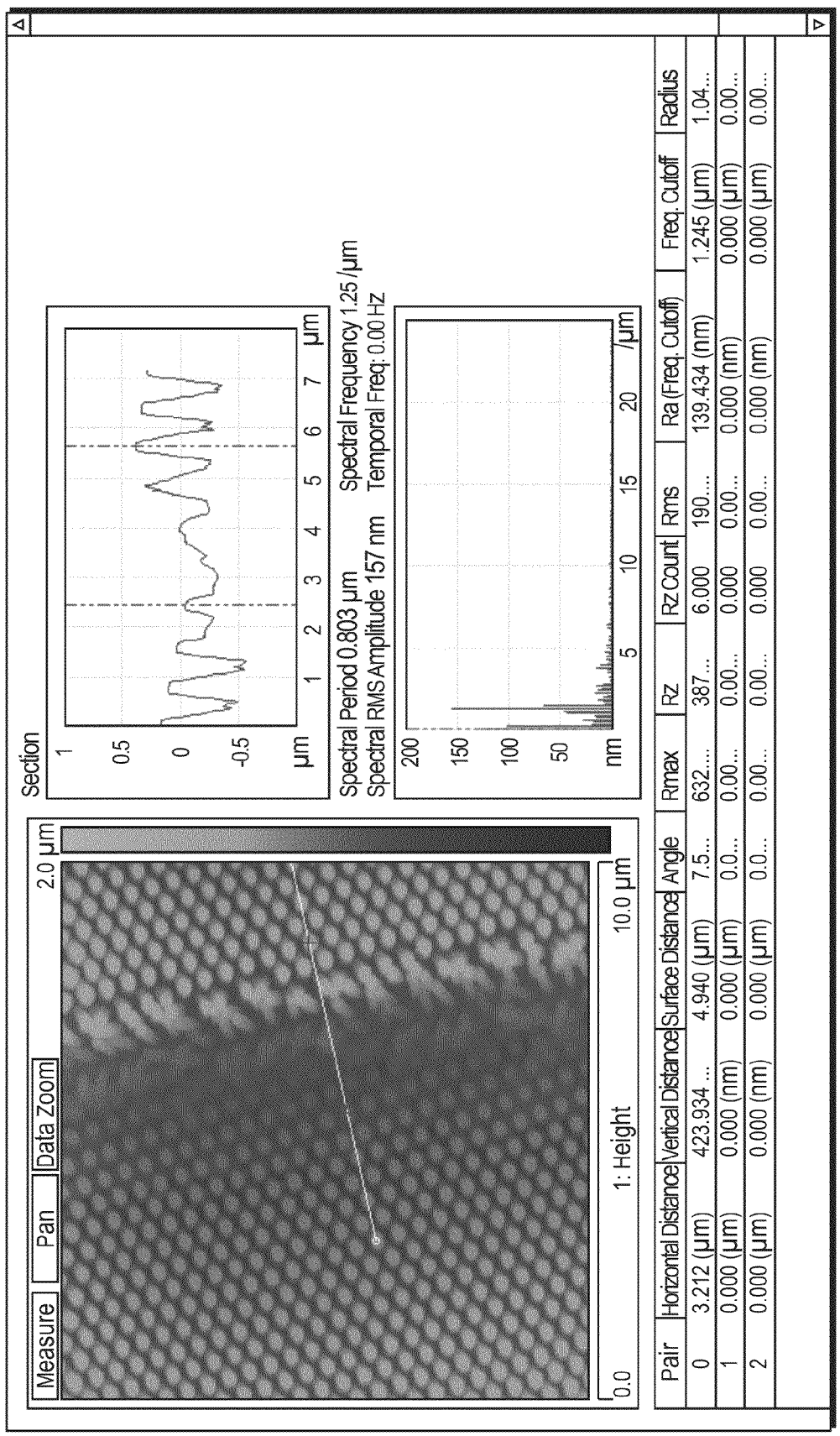
FIG. 6 shows a SEM image of a seam produced by a method according to another embodiment of the present invention.

Place 5 Mil PET substrate (MELINEX® 453, DuPont Teijin Films), treated side up on a steel plate laminator, and nip the edge of the mold on the acrylic substrate using a rubber roller (durometer 60) at a nip pressure of ~15 psi. Apply a bead of uv curable liquid (Trimethylolpropane ethoxylate (14/3 EO/OH triacrylate, average Mn 428, Sigma-Aldrich, 1 w/w % diphenyl(2,4,6-trimethylbenzoyl)phosphine oxide/2-hydroxy-2-methylpropiophenone 50:50 blend) at the nip point. Uniformly roll the mold in contact with the substrate at a rate of 0.5-1 ft/min. A mask is placed over the laminate prior to the trailing edge of fluid in order to prevent curing outside of the patterned area. Place the substrate-mold into the UV flood chamber and cured for 1 minute. Peel the Fluorocur mold from the PET substrate. The mold is then repositioned and nipped such that the nip point is on the patterned area, and a bead of the aforementioned UV-curable liquid is applied at the nip point. Similar to above, the mold is uniformly rolled out in contact with the substrate, and masked at the trailing end prior to the end of the patterned area. The substrate is placed into the UV chamber and cured for 1 minute. The second mold is then removed to reveal a second cured, patterned area adjoining the first by a seam. Uncured liquid residue is then washed from the patterned area, including the seam, with 2-isopropanol and dried. The dimensions of this seam are approximately 2 micrometers in width and 250 nm in height. An AFM image of this seam is given in FIG. 6.

EXAMPLE 4

Thin FLUOROCUR® molds were produced by laminating a thin film of FLUOROCUR® resin between a master template having a patterned array of 200×200 nm cylindrical posts and a 6" wide sheet of PET (MELINEX® D316, DuPont Teijin Films). The mold was placed in a UV flood curing chamber and exposed to UV (approximate output of 125 mW/cm$^2$) for 4 minutes. The PET-Fluorocur laminate was then peeled from the master and trimmed. The approximate patterned area of the mold is 5"×5" square. The Fluorocur thin molds are then used to tile a larger area pattern on acrylic using the following steps.

The acrylic is coated with a tie layer by depositing a film of the tie-layer polymer (from example 1) in a chloroform solution at 15 w/w % via lamination between the acrylic and a PET film, allowing the laminate to sit for approximately 15 h, then removing the film to expose a tie-layer coating. Place the acrylic on a steel plate laminator, and nip the edge of the mold on the acrylic substrate using a rubber roll (durometer ~50) at a nip pressure of ~15 psi. Apply a bead of uv curable liquid (Trimethylolpropane ethoxylate (14/3 EO/OH triacrylate, average Mn 428, Sigma-Aldrich, 1 w/w % diphenyl(2,4,6-trimethylbenzoyl)phosphine oxide/2-hydroxy-2-methylpropiophenone 50:50 blend) at the nip point with an approximate volume of 50 µL at the nip point. Uniformly roll the mold in contact with the substrate at a rate of 0.5-1 ft/min. The bead of liquid should be exhausted before the end of the mold (starve point), such that the mold is in contact with the acrylic substrate at the end. Place the substrate-mold into the UV flood chamber and cure for 1 minute. Peel the Fluorocur mold from the PET substrate. The mold is then repositioned and nipped such that the nip point is on the patterned area, before the starve point, and a bead of liquid of defined volume is applied at the nip point. Similar to above, the mold is uniformly rolled out in contact with the substrate, again exhausting the bead before the end. The substrate is placed into the UV chamber and cured for 1 minute. The second mold is then removed to reveal a second cured, patterned area adjoining the first by a seam. The dimensions of this seam are approximately 3 micrometers width and 500 nm height.

EXAMPLE 5

Thin FLUOROCUR® molds were produced by laminating a thin film of Fluorocur® OAE-01 resin between a master template having a patterned array of 200×200 nm cylindrical posts and a 6" wide sheet of PET (MELINEX® D316, DuPont Teijin Films). The mold was placed in a UV flood curing chamber and exposed to UV (approximate output of 125 mW/cm$^2$) for 4 minutes. The PET-Fluorocur laminate was then peeled from the master and trimmed. The approximate patterned area of the mold is 5"×5" square. The Fluorocur thin molds can then be used to tile a larger area pattern on PET using the following steps.

First, a piece of PET substrate can be cut in a dimension slightly larger than the desired tiled size. A UV mask can be applied to the unpatterned side of the mold, either directly on the mold or as a second layer. The patterned side of the mold can be coated with a uniform thin layer of TEGO RC 711, a UV curable resin, formulated with 1% diphenyl(2,4,6-trimethylbenzoyl)phosphine oxide/2-hydroxy-2-methylpropiophenone blend as a photoinititiator using a slot or bar (mayer rod) coater. The edge of the mold would be placed on the PET substrate, and nipped in place using pressure of ~15 psi between a steel roller and a rubber roller of durometer 50-65. The mold can be rolled out in contact with the substrate at a rate of 0.5-1 ft/min, rolling in a direction away from the seam as shown, for example, in the embodiment depicted in FIG. 4C. Additional masking material can be added if desired. The substrate-mold would be placed into the UV flood chamber (collimated UV) and cured for approximately 20 seconds. The Fluorocur mold can then be peeled from the PET substrate. The area underneath the mold exposed to the UV would be cured into a pattern that reflects the pattern of the mold, while the masked area around the mold would not cure. The entire mold would then be recoated with uv curable resin. One edge can be laid over the patterned area and nipped in place. The mold can then be rolled out in a similar manner away from the seam point. Additional masking material can be added if desired. The substrate would be placed into the UV chamber and cured for 20 seconds. The second mold would then removed to reveal a second cured, patterned area adjoining the first by a seam, as shown, for example, in the embodiment depicted in FIG. 4F. The remaining uncured areas can be washed away with IPA. The dimensions of this seam would be approximately 3 micrometers in width and 1 micrometer in height.

While the invention has been described above with respect to particular embodiments, modifications and substitutions within the spirit and scope of the invention will be apparent to those of skill in the art. It should also be apparent that individual elements identified herein as belonging to a particular embodiment may be included in other embodiments of the invention. The present invention may be embodied in other specific forms without departing from the central attributes thereof. Therefore, the illustrated and described embodiments and examples should be considered in all respects as illustrative and not restrictive, reference being made to the appended claims to indicate the scope of the invention.

The invention claimed is:

1. A method for fabricating a substantially seamless pattern, comprising;
   a. providing a first portion of curable material between a substantially flexible first patterned mold and a substrate proximate a first nip point provided by at least one roller;
   b. passing the first portion of curable material, the first mold, and the substrate through the first nip point to spread the first portion of curable material by the first mold into a first layer of curable material over the substrate;
   c. curing the first layer of curable material to form a first cured portion;
   d. removing the first mold from the first cured portion;
   e. after step d., providing a second portion of curable material over at least a portion of the first cured portion between a substantially flexible second patterned mold and the substrate proximate a second nip point provided by the at least one roller;
   f. passing the second portion of curable material, the second mold, and the substrate through the second nip point to spread the second portion of curable material by the second mold into a second layer of curable material over the substrate;
   g. curing the second layer of curable material to form a second cured portion joined by a seam to the first cured portion; and
   h. removing the second mold from the second cured portion,
   wherein the seam between the first cured portion and the second cured portion has a dimension of less than about 5 micrometers,
   wherein step b. results in depletion of the first portion of curable material prior to the first mold and substrate exiting the first nip point so that the first portion of curable material tapers to depletion between the first mold and substrate, and
   wherein step e. results in adding the second portion of curable material to at least a portion of the depleted portion of the first cured portion so that upon completion of step h., the second portion of curable material substantially fills the tapered depletion to a pre-depletion thickness.

2. The method of claim 1, wherein the first and second molds comprise a fluoropolymer.

3. The method of claim 1, wherein the dimension of the seam is less than about 1 micrometer.

4. The method of claim 1, wherein the dimension of the seam is less than about 500 nanometers.

5. The method of claim 1, wherein curing the first portion of curable material forms a first patterned region in the first cured portion and curing the second portion of curable material forms a second patterned region in the second cured portion, and wherein a seam between the first patterned region and the second patterned region has a dimension less than about 250 nanometers.

6. The method of claim 1, wherein the first and second molds are the same mold.

7. The method of claim 1, wherein the first and second molds are different molds.

8. The method of claim 1, wherein the first and second nip points are provided by the at least one roller and a second roller.

* * * * *